(12) United States Patent
Netsu et al.

(10) Patent No.: US 11,440,804 B2
(45) Date of Patent: Sep. 13, 2022

(54) PROCESS FOR PRODUCING POLYCRYSTALLINE SILICON MASS

(71) Applicant: Shin-Etsu Chemical Co., Ltd., Tokyo (JP)

(72) Inventors: Shigeyoshi Netsu, Niigata (JP); Junichi Okada, Niigata (JP); Fumitaka Kume, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1080 days.

(21) Appl. No.: 16/050,767

(22) Filed: Jul. 31, 2018

(65) Prior Publication Data

US 2018/0339908 A1 Nov. 29, 2018

Related U.S. Application Data

(62) Division of application No. 13/496,693, filed as application No. PCT/JP2010/004668 on Jul. 21, 2010, now abandoned.

(30) Foreign Application Priority Data

Sep. 16, 2009 (JP) ................................. 2009-214519

(51) Int. Cl.
*C01B 33/035* (2006.01)
*C01B 33/037* (2006.01)
(Continued)

(52) U.S. Cl.
CPC .......... *C01B 33/035* (2013.01); *C01B 33/037* (2013.01); *C30B 23/00* (2013.01); *C30B 29/06* (2013.01)

(58) Field of Classification Search
CPC ...... C01B 33/035; C01B 33/037; C23C 16/24
See application file for complete search history.

(56) References Cited

U.S. PATENT DOCUMENTS 5,067,989 A 11/1991 Yokota et al.
5,976,481 A 11/1999 Kubota et al.
(Continued)

FOREIGN PATENT DOCUMENTS

DE 10 2007 027 110 A1 12/2008
DE 10 2008 040 231 A1 12/2008
(Continued)

OTHER PUBLICATIONS

Zhang, Pan, et al., "Effect of Boundary Layers on Polycrystalline Silicon Chemical Vapor Deposition in a Trichlorosilane and Hydrogen System". Chinese Journal of Chemical Engineering, 19(1) (2011), pp. 1-9.*
(Continued)

*Primary Examiner* — Bret P Chen
(74) *Attorney, Agent, or Firm* — Oblon, McClelland, Maier & Neustadt, L.L.P.

(57) ABSTRACT

A clean and high-purity polycrystalline silicon mass having a small content of chromium, iron, nickel, copper, and cobalt in total, which are heavy metal impurities that reduce the quality of single-crystal silicon, can be obtained from a silicon rod by before crushing a polycrystalline silicon rod, removing at least 70 mm of a polycrystalline silicon portion from the electrode side end of the polycrystalline silicon rod extracted to the outside of a reactor is provided. Thereby, the polycrystalline silicon portion in which the total of the chromium, iron, nickel, copper, and cobalt concentrations in a bulk is not less than 150 ppta can be removed.

11 Claims, 5 Drawing Sheets

(51) Int. Cl.
*C30B 23/00* (2006.01)
*C30B 29/06* (2006.01)

(56) References Cited

U.S. PATENT DOCUMENTS

| | | | |
|---|---|---|---|
| 6,309,467 B1 | 10/2001 | Wochner et al. | |
| 6,479,824 B1* | 11/2002 | Hoffman | G01T 1/2002 |
| | | | 250/367 |
| 2001/0032583 A1 | 10/2001 | Kraus et al. | |
| 2002/0014197 A1* | 2/2002 | Keck | C23C 16/24 |
| | | | 117/200 |
| 2002/0132383 A1* | 9/2002 | Hiroki | H01L 22/14 |
| | | | 257/E27.113 |
| 2003/0150378 A1* | 8/2003 | Winterton | C01B 33/035 |
| | | | 117/87 |
| 2003/0159647 A1* | 8/2003 | Arvidson | B07B 13/04 |
| | | | 117/30 |
| 2004/0051153 A1* | 3/2004 | Yamamoto | H01L 21/324 |
| | | | 257/E21.654 |
| 2005/0020021 A1* | 1/2005 | Fujiwara | H01L 21/76897 |
| | | | 257/E21.507 |
| 2006/0042539 A1* | 3/2006 | Ohta | C30B 29/06 |
| | | | 117/13 |
| 2006/0070569 A1* | 4/2006 | Andrejewski | C30B 29/06 |
| | | | 117/13 |
| 2007/0235574 A1* | 10/2007 | Schaefer | B07C 5/08 |
| | | | 241/36 |
| 2007/0251455 A1* | 11/2007 | Wan | C01B 33/035 |
| | | | 118/724 |
| 2008/0006293 A1 | 1/2008 | Wochner et al. | |
| 2008/0053232 A1 | 3/2008 | Hegen et al. | |
| 2008/0124915 A1* | 5/2008 | Yamaguchi | H01L 27/14806 |
| | | | 257/E21.586 |
| 2008/0233330 A1 | 9/2008 | Ohashi | |
| 2008/0286550 A1 | 11/2008 | Sofin et al. | |
| 2009/0017335 A1 | 1/2009 | Takai | |
| 2009/0060824 A1 | 3/2009 | Sakai | |
| 2009/0098415 A1 | 4/2009 | Ohashi | |
| 2009/0114748 A1* | 5/2009 | Gruebl | C01B 33/02 |
| | | | 241/294 |
| 2009/0120848 A1* | 5/2009 | Schaefer | B07B 13/04 |
| | | | 209/314 |
| 2009/0220821 A1 | 9/2009 | Ohashi | |
| 2010/0154357 A1 | 6/2010 | Wochner et al. | |
| 2010/0219380 A1 | 9/2010 | Hertlein et al. | |
| 2011/0186087 A1 | 8/2011 | Wochner et al. | |
| 2011/0253177 A1 | 10/2011 | Sakai et al. | |
| 2011/0253823 A1* | 10/2011 | Murai | B02C 1/005 |
| | | | 241/198.1 |
| 2011/0268892 A1* | 11/2011 | Oda | C01B 33/035 |
| | | | 427/593 |
| 2011/0274926 A1* | 11/2011 | Oda | C23C 16/4418 |
| | | | 118/725 |
| 2012/0175613 A1* | 7/2012 | Netsu | C01B 33/037 |
| | | | 438/500 |
| 2015/0003952 A1* | 1/2015 | Kurosawa | B66C 3/02 |
| | | | 414/785 |
| 2017/0283981 A1* | 10/2017 | Yasumura | H01L 31/1804 |
| 2019/0002295 A1* | 1/2019 | Kurosawa | C23C 16/24 |

FOREIGN PATENT DOCUMENTS

| | | |
|---|---|---|
| DE | 10 2007 047 210 A1 | 4/2009 |
| EP | 0 905 796 A1 | 3/1999 |
| EP | 1 992 593 A2 | 11/2008 |
| EP | 2 039 654 A2 | 3/2009 |
| JP | 3 80193 | 4/1991 |
| JP | 4-230029 A | 8/1992 |
| JP | 04 357106 | 12/1992 |
| JP | 4-357106 | 12/1992 |
| JP | 05 004811 | 1/1993 |
| JP | 08 067511 | 3/1996 |
| JP | 10-29895 | 2/1998 |
| JP | 11 168076 | 6/1999 |
| JP | 11-183342 | 7/1999 |
| JP | 2000 128692 | 5/2000 |
| JP | 2000-302594 | 10/2000 |
| JP | 2001-206798 | 7/2001 |
| JP | 2002-068725 A | 3/2002 |
| JP | 2002-508294 * | 3/2002 ............ C01B 33/02 |
| JP | 3357675 B2 | 12/2002 |
| JP | 2003 306321 | 10/2003 |
| JP | 2004-161595 | 6/2004 |
| JP | 2005-288332 A | 10/2005 |
| JP | 2006-21973 A | 1/2006 |
| JP | 2006-169044 A | 6/2006 |
| JP | 2008-58314 | 3/2008 |
| JP | 2008-123620 | 5/2008 |
| JP | 2008-234750 | 10/2008 |
| JP | 2008/151978 A1 | 12/2008 |
| JP | 2009-20920 | 1/2009 |
| JP | 2009-93758 | 4/2009 |
| JP | 2009-114026 | 5/2009 |
| JP | 2009-184922 | 8/2009 |
| JP | 2009-199633 | 9/2009 |
| JP | 2016-138021 * | 8/2016 ........... C01B 33/035 |
| WO | 1997 044277 | 11/1997 |
| WO | 2009/033900 A2 | 3/2009 |

OTHER PUBLICATIONS

Braga, A.F.B., et al., "New processes for the production of solar-grade polycrystalline silicon: A review". Solar Energy Materials and Solar Cells (2007), pp. 1-7. doi:10.1016/j.solmat.2007.10.003.*
Shindo, Wataru, et al., "Low-temperature large-grain poly-Si direct deposition by microwave plasma enhanced chemical vapor deposition using SiH4/Xe". J. Vac. Sci. Technol. A 17(5), Sep./Oct. 1999, pp. 3134-3138.*
Yu, S., et al., "Selective deposition of polycrystalline silicon thin films at low temperature by hot-wire chemical vapor deposition". Appl. Phys. Lett. 68, 2681 (1996) 1 page. Abstract Only.*
Rath, J.K., et al., "Low-temperature deposition of polycrystalline silicon thin films by hot-wire CVD". Solar Energy Materials and Solar Cells 48 (1997) 269-277.*
Cifre, J., et al., "Polycrystalline silicon films obtained by hot-wire chemical vapour deposition". Appl. Phys. A 59, 645-651 (1994).*
Fang, M, et al., "Numerical Analysis of the Chemical Vapor Deposition of Polysilicon in a Trichlorosilane and Hydrogen System". Energy Procedia 61 (2014) 1987-1991.*
Li, Xue-Gang, et al., "Silane Pyrolysis to Silicon Rod in a Bell-Jar Reactor at High Temperature and Pressure: Modeling and Simulation". Ind. Eng. Chem. Res. 2016, 55, 4887-4896.*
"Shirikon no Kagaku (Science of Silicon)," p. 100, Table 5, Realize Science & Engineering Center Co., Ltd., 1996.
International Search Report dated Sep. 28, 2010 in PCT/JP10/004668 filed on Jul. 21, 2010.
Information Offer Form with English Translation issued Feb. 2, 2012 in Patent Application No. 2009-214519.
Information Offer Form issued Mar. 27, 2012 in Japanese Patent Application No. 2009-214519 (with English translation).
Information Offer Form issued Dec. 27, 2012 in Japanese Patent Application No. 2009-214519 (with English-language translation).
Toshiyuki Takada, "Polycrystalline Silicon Materials", Feature Presentation/A Full Review of Semiconductor-related Materials, Denshi Zairyo (Electronic Materials), vol. 32, No. 11, Nov. 1993. pp. 27-31 (plus English-language translation).
Extended European Search Report dated Jun. 2, 2014 in Patent Application No. 10816827.9.
Reasons for Submission and Information Offer Form issued Feb. 12, 2013 in Japanese Patent Application No. 2009-214519 (with English translation).
Office Action dated Jun. 25, 2013, in Japanese Patent Application No. 2009-214519.
Combined Office Action and Search Report dated Jun. 20, 2013 in Chinese Patent Application No. 201080041462.8 (with English translation of category of cited documents).

(56) References Cited

OTHER PUBLICATIONS

Information Offer Form Filed Sep. 13, 2013 in Japanese Application No. 2009-214519 (With English Translation).
R. L. Lane, et al., "Multiple czochralski growth of silicon crystals from a single crucible", Journal of Crystal Growth, vol. 50, No. 2, XP024419892, Oct. 1, 1980, pp. 437-444.
Analysis of Trace Elements in Polysilicon For Solar Applications, Jul. 2012, http://www.chemtrace.com/files/Analysis%20of%20Trace%20Elements%20in%20Polysilicon%20for%20Solar%20Application%20Rev0%20July%202012 (accessed Jun. 9, 2015).
Commercial Poly-Silicon Specification, Nov. 2000, http://www.tf.uni-kiel.de/matwis/amat/elmat_en/kap_6/illustr/i6_1_4.html (accessed Jun. 9, 2015).
Borionetti et al.—"Influence of Polysilicon and Crucible Purity on the Minority Carrier Recombination Lifetime of Czochralski Silicon Crystals", Semiconductor Silicon pp. 104-110, 1994.
Information Offer Form Filed Sep. 27, 2013 in Japanese Application No. 2009-214519 (With English Translation).

* cited by examiner

[FIG.1]
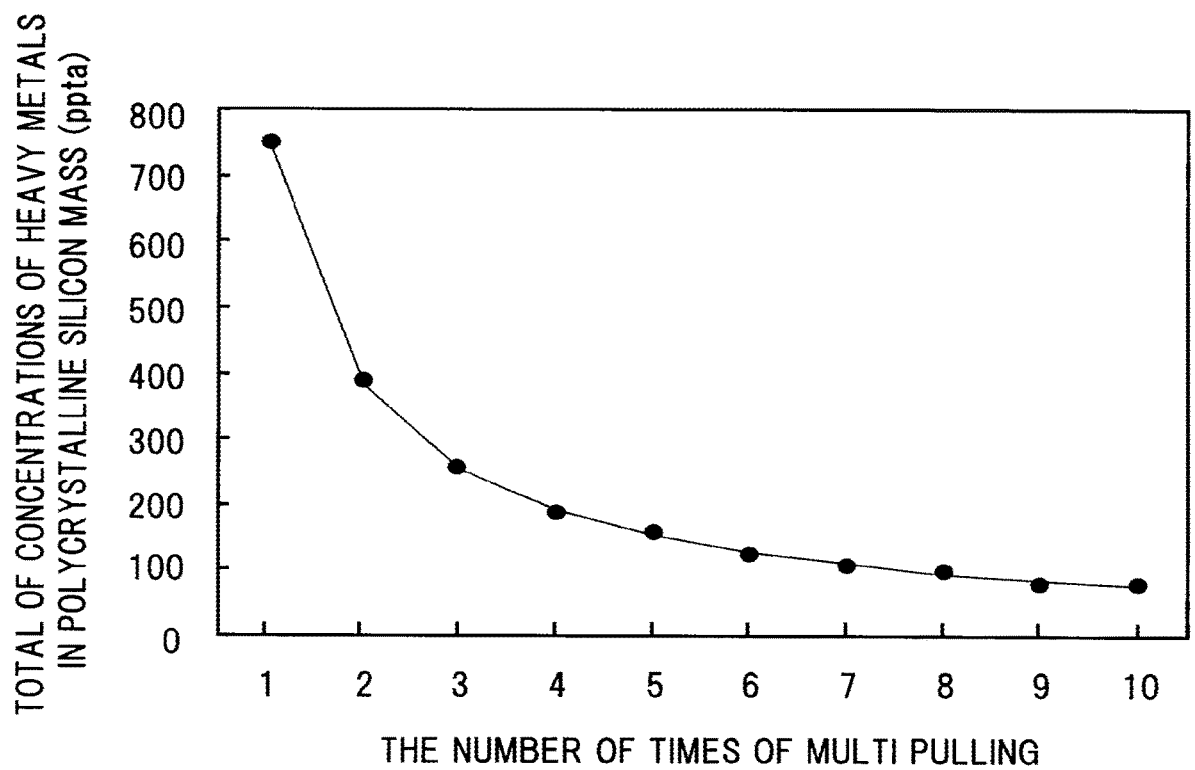

[FIG.2]
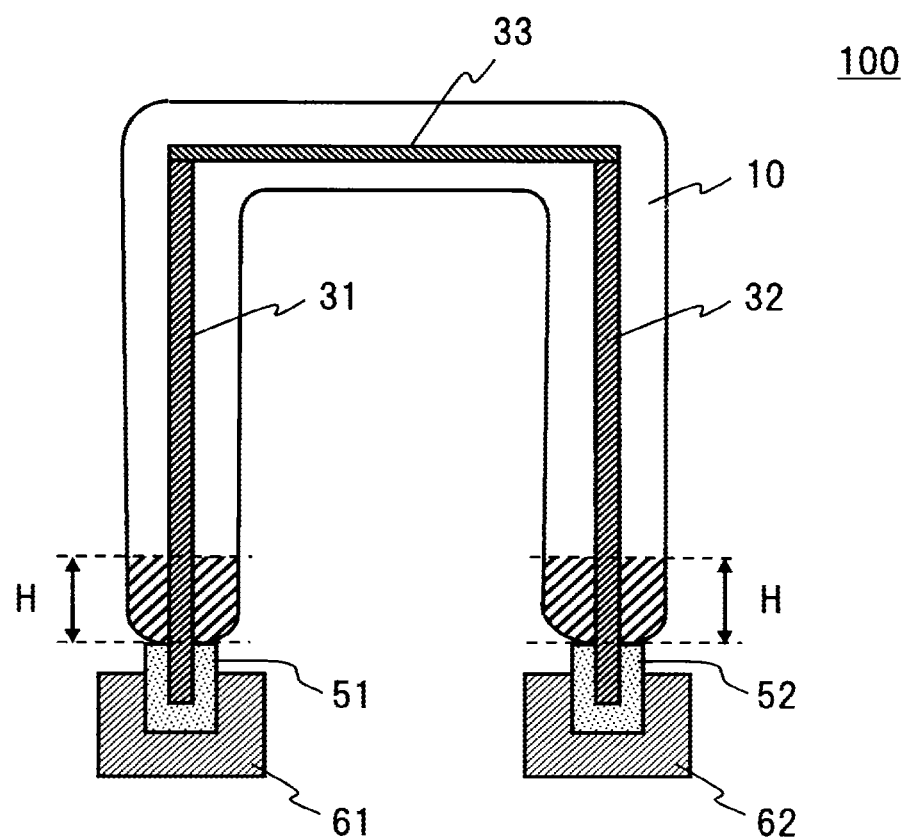

[FIG.3]
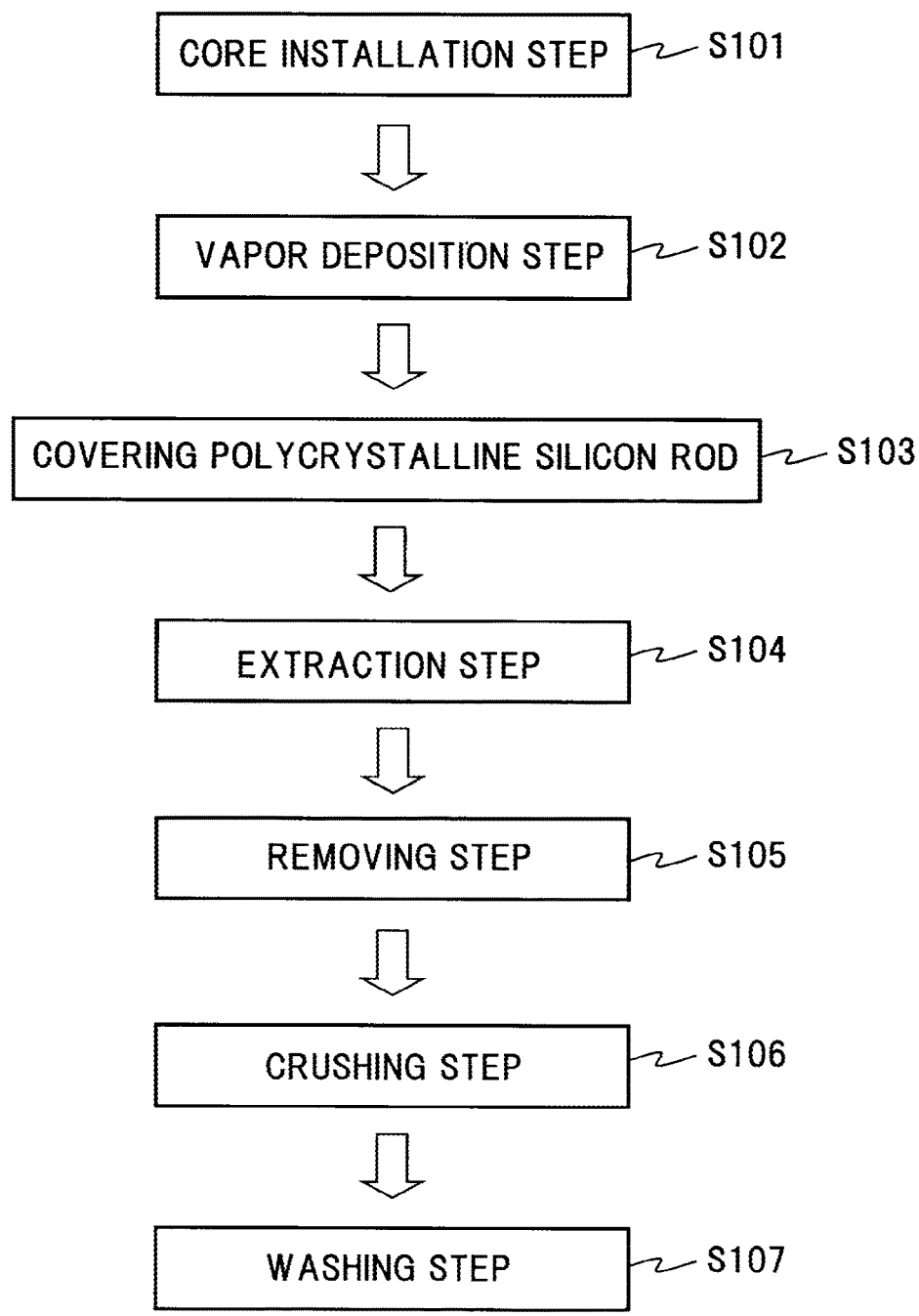

[FIG.4]
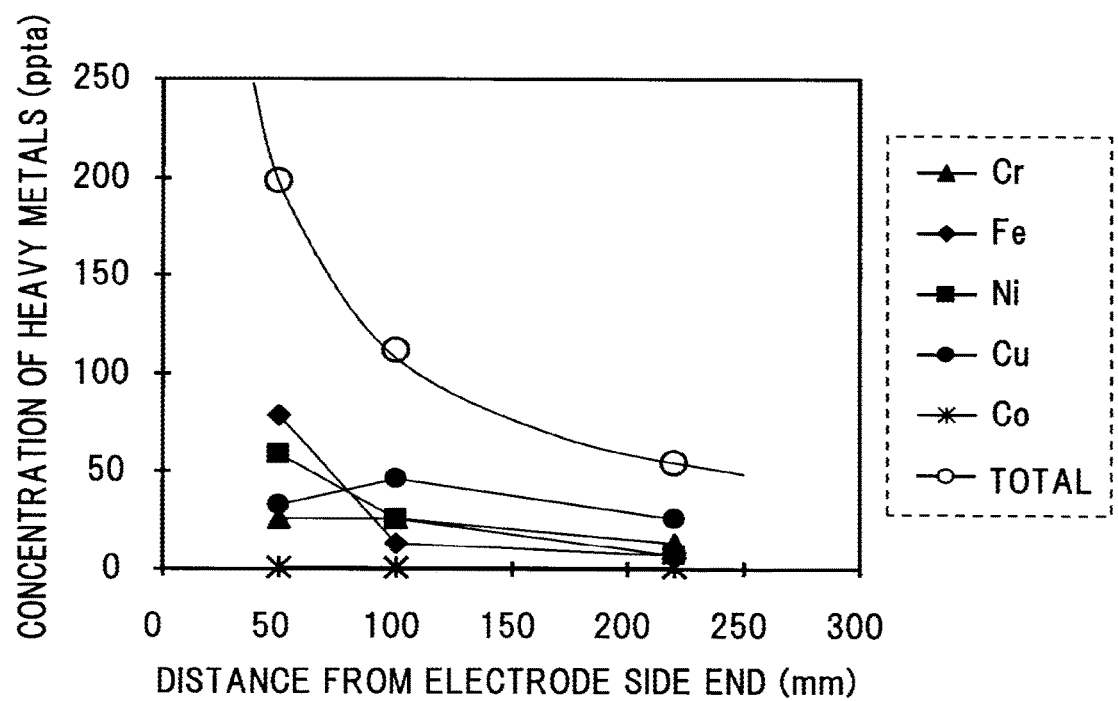

[FIG.5]
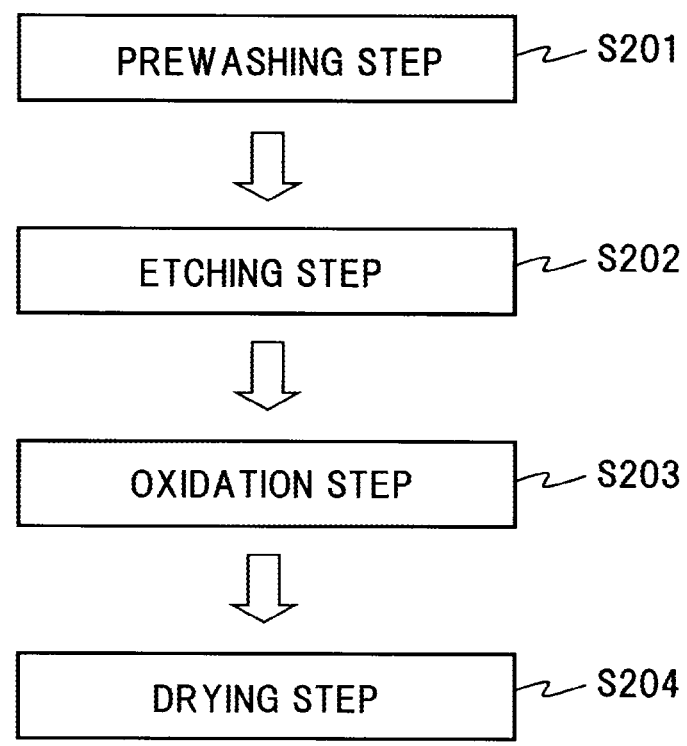

PROCESS FOR PRODUCING POLYCRYSTALLINE SILICON MASS

CROSS REFERENCE TO RELATED APPLICATIONS

The present application is a Divisional of U.S. application Ser. No. 13/496,693, filed on Mar. 16, 2012, now abandoned, which is a 35U.S.C. § 371 national stage patent application of International patent application PCT/JP2010/004668, filed on Jul. 21, 2010, the text of which is incorporated by reference, and claims the benefit of the filing date of Japanese application no. 2009-214519, filed on Sep. 16, 2009, the text of which is also incorporated by reference.

TECHNICAL FIELD

The present invention relates to a technique for producing a polycrystalline silicon mass, and more specifically, relates to a technique for producing a high purity polycrystalline silicon mass suitable for a raw material for growth of single-crystal silicon by a multi pulling method in particular.

BACKGROUND ART

A Siemens method is known as a method for producing polycrystalline silicon used as a raw material for silicon single-crystal substrates. The Siemens method is a method in which a raw material gas containing chlorosilane is contacted with a heated silicon core wire, and polycrystalline silicon is vapor deposited on the surface of the silicon core wire by a CVD (Chemical Vapor Deposition) method.

Usually, production of polycrystalline silicon by the Siemens method is performed according to the following steps, for example. First, two silicon core wires in the vertical direction and one silicon core wire in the horizontal direction are assembled into a Π-shape (approximately inverted U-shaped) within a reactor of a vapor deposition apparatus, and the ends of the two core wires in the vertical direction are each fixed to metal electrodes through conductive holders (a core installation step).

Next, while a current is conducted from the metal electrodes to heat the Π-shaped silicon core wire in a hydrogen atmosphere, a raw material gas such as trichlorosilane is fed into the reactor, and polycrystalline silicon is vapor deposited on the core wire in an inverted U-shape. Thereby, a polycrystalline silicon rod having a desired diameter is obtained (a vapor deposition step).

After the inside of the reactor is cooled, the polycrystalline silicon rod is extracted from the reactor using a crane or the like (an extraction step).

The entire polycrystalline silicon rod extracted to the outside of the reactor is crushed using a crusher or a hammer to prepare polycrystalline silicon masses having a size suitable for feeding to a quartz crucible used for growth of a single-crystal silicon ingot by the CZ (Czochralski) method (a crushing step).

Finally, the polycrystalline silicon masses are washed, and foreign substances and impurities adhering to the surfaces of the polycrystalline silicon masses are removed to obtain clean polycrystalline silicon (a washing step).

Recently, as integration density of semiconductor devices as final products is increased, high purity of CZ single-crystal silicon that is a material of a substrate for highly integrated semiconductor devices has been severely demanded. Inevitably, higher purity of the polycrystalline silicon mass used as the raw material for the CZ single-crystal silicon has been more severely demanded.

If the polycrystalline silicon mass has insufficient purity and contains heavy metals such as iron and copper, these impurities are molten into a silicon melt, and taken into the CZ single-crystal silicon to be grown, inhibiting higher purity. Such impurities taken from the polycrystalline silicon mass into the silicon melt are particularly serious in the case where the CZ single-crystal silicon is grown by a multi pulling method.

The multi pulling method is a method for crystal growth in which in a single batch, after a single-crystal silicon ingot is pulled up, the polycrystalline silicon masses are newly added into the remaining silicon melt without turning off the power supply of the heater that heats a quartz crucible, thereby to pull up another single-crystal silicon ingot; the procedure is repeated to obtain a plurality of single-crystal silicon ingots. The method is devised for the purpose of improvement in productivity of the CZ single-crystal silicon and reduction in production cost.

Usually, heavy metal elements such as iron and copper have a segregation coefficient k greatly less than 1 as an index indicating how easily the element is taken from the silicon melt (liquid phase) into the silicon crystal (solid phase) at a solid-liquid interface. Accordingly, these heavy metal elements are likely to remain in the silicon melt.

Accordingly, in the case where the CZ single-crystal silicon ingot is grown by the multi pulling method, as the number of the single-crystal silicon ingot to be pulled up in one batch is increased and as the single-crystal silicon ingot is pulled up later in the one batch, the impurities having a segregation coefficient k less than 1 are grown from the silicon melt having a high concentration of "condensed" impurities. For this, the concentration of the impurities taken into the single-crystal silicon is gradually increased.

The heavy metal impurities in the single-crystal silicon cause OSFs (Oxidation induced Stacking Faults) and a reduced lifetime of minority carriers to reduce the quality of the CZ single-crystal silicon. For this reason, it is important to reduce the amount of the heavy metal impurities to be taken from the polycrystalline silicon mass as the raw material for the CZ single-crystal silicon into the crucible (the silicon melt) as much as possible, and the polycrystalline silicon mass having sufficiently high purity is needed.

In order to provide higher purity of the polycrystalline silicon mass as the raw material used for growth of single-crystal silicon, a variety of washing methods has been proposed. For example, Japanese Patent Laid-Open No. 4-357106 (Patent Literature 1) discloses a technique in which the surface of silicon is irradiated with a microwave or dried at a high temperature, and Si—H bonds on the surface of silicon subjected to etching are reduced to form a coating of $SiO_2$. Unfortunately, even if such a treatment is performed, the remaining Si—H bonds may adsorb metal grains floating in a work atmosphere (environment).

Japanese Patent Laid-Open No. 8-67511 (Patent Literature 2) discloses a washing method in which polycrystalline silicon is sequentially washed by an oxidizing chemical solution, water, and a chemical solution that can decompose an oxide film, thereby to obtain high purity polycrystalline silicon whose surface is not contaminated by iron atoms. Unfortunately, in the washing method, because polycrystalline silicon is finally washed by the chemical solution that can decompose the oxide film (for example, hydrofluoric acid), the surfaces of the silicon masses are chemically activated, and likely to be susceptible to contamination from an environment.

Japanese Patent Laid-Open No. 11-168076 (Patent Literature 3) discloses a washing method for providing polycrystalline silicon containing an extremely small amount of iron/chromium, the method comprising: prewashing a semiconductor material using an oxidizing washing liquid as at least one step, washing the material using a washing liquid containing nitric acid and hydrofluoric acid as a main washing step, and washing the material as another step in a hydrophilization process using an oxidizing washing liquid. Unfortunately, it is unclear whether the washing method is effective for reduction in the amount of heavy metal impurities to be contained other than iron and chromium.

Japanese Patent Laid-Open No. 2000-128692 (Patent Literature 4) discloses a washing method comprising the steps of: washing massive or granular polysilicon by a dissolved ozone aqueous solution, and washing the polysilicon washed by the dissolved ozone aqueous solution by hydrofluoric acid, wherein the two steps are performed in this order once or repeated more than once. Unfortunately, in the washing method, as in the washing method disclosed in Patent Literature 2 above, because polycrystalline silicon is finally washed by hydrofluoric acid, the surfaces of the polycrystalline silicon masses are chemically activated, and likely to be susceptible to contamination from an environment.

Japanese Patent Laid-Open No. 5-4811 (Patent Literature 5) discloses a method in which as a pre-step for the CZ single-crystal pulling method, polycrystalline silicon is washed by a mixed solution of hydrofluoric acid, hydrogen peroxide, and water, thereby to reduce the concentration of heavy metals of Fe, Cu, Ni, and Cr on the surface of polycrystalline silicon.

Unfortunately, the method is a washing method as part of a method for growing single-crystal silicon, and needs to be performed immediately before polycrystalline silicon masses are charged into a quartz crucible for pulling up CZ single-crystal.

CITATION LIST

Patent Literature

Patent Literature 1: Japanese Patent Laid-Open No. 4-357106
Patent Literature 2: Japanese Patent Laid-Open No. 8-67511
Patent Literature 3: Japanese Patent Laid-Open No. 11-168076
Patent Literature 4: Japanese Patent Laid-Open No. 2000-128692
Patent Literature 5: Japanese Patent Laid-Open No. 5-4811

Non Patent Literature

Non Patent Literature 1: "Shirikon no Kagaku (Science of Silicon)," p. 100, Table 5 (Realize Science & Engineering Center Co., Ltd., 1996)

SUMMARY OF INVENTION

Technical Problem

These related arts relate to the washing method for cleaning the surface of the polycrystalline silicon mass. The heavy metal impurities taken from the polycrystalline silicon mass into the crucible (silicon melt), however, are contained not only in the surface of the polycrystalline silicon mass but also in the entire bulk of the polycrystalline silicon mass.

In the step of producing the polycrystalline silicon mass, many sources to produce the heavy metal impurities that may be taken into the bulk or adhering to the surface of the polycrystalline silicon mass exist. For example, a heat resistant stainless steel plate is used for the wall and baseplate of the reactor in the vapor deposition apparatus, and if the stainless steel plate is corroded, metal grains containing nickel and chromium are spread in the growth atmosphere. Moreover, copper or stainless steel is used for the metal electrode. For this reason, nickel, chromium, and copper are likely to be taken into the bulk of polycrystalline silicon.

After vapor deposition is completed, by use of a crane to extract the polycrystalline silicon rod, iron powder is produced from the crane.

In the case where the polycrystalline silicon rod is crushed using a jaw crusher, a roll crusher, or a hammer, cemented carbide used for these crushing means contacts with polycrystalline silicon. As the cemented carbide, a material prepared by sintering tungsten carbide with a cobalt alloy is used, and iron and cobalt are likely to adhere to the surface of the polycrystalline silicon mass.

Further, after the deposition reaction of polycrystalline silicon is completed, when the reactor is opened to the work atmosphere, metal grains containing nickel, chromium, and copper are spread from the inside of the reactor to the work atmosphere, and these metal grains are likely to adhere to the surface of the polycrystalline silicon mass.

The present invention has been made in consideration of the problems above, and an object of the present invention is to provide a clean and high-purity polycrystalline silicon mass having a small content of chromium, iron, nickel, copper, and cobalt in total, which are heavy metal impurities that reduce the quality of single-crystal silicon.

Solution to Problem

In order to solve the problems above, in a polycrystalline silicon mass according to the present invention, a total of concentrations of impurities of chromium, iron, nickel, copper, and cobalt detected from a bulk is not more than 150 ppta. Preferably, the total of the concentrations of the impurities is not more than 100 ppta. More preferably, the total of the concentrations of the impurities is not more than 75 ppta.

The concentrations of the impurities can be determined by an inductively coupled plasma mass spectrometry (ICP-MS) method. Preferably, the surface of the polycrystalline silicon mass according to the present invention is coated with a silicon oxide film.

Moreover, the polycrystalline silicon mass according to the present invention is a polycrystalline silicon mass for multi pulling in which up to 10 single-crystal silicon ingots are pulled up by a CZ method in one batch, wherein a total of concentrations of impurities of chromium, iron, nickel, copper, and cobalt detected from a bulk is not more than 75 ppta, and a surface of the polycrystalline silicon mass is coated with a silicon oxide film.

A process for producing a polycrystalline silicon mass according to the present invention comprises: a vapor deposition step of depositing silicon on a core wire to grow a polycrystalline silicon rod, one end of the core wire being connected to a first electrode and the other end thereof being connected to a second electrode; an extraction step of extracting the polycrystalline silicon rod to an outside of a reactor; and a crushing step of forming the polycrystalline silicon rod into polycrystalline silicon masses, the process further comprising a removing step of removing at least 70 mm of a polycrystalline silicon portion from an electrode side end of the polycrystalline silicon rod extracted to the outside of the reactor before the crushing step.

Preferably, at least 155 mm of the polycrystalline silicon portion from the electrode side end is removed in the removing step.

Moreover, preferably, a surface of the polycrystalline silicon rod is covered with a bag-like member and extracted to the outside of the reactor in the extraction step. More preferably, after the polycrystalline silicon rod is extracted to the outside of the reactor, an opening of the bag-like member that covers the surface of the polycrystalline silicon rod is sealed. The bag-like member is a polyethylene bag, for example.

The process for producing a polycrystalline silicon mass according to the present invention may comprise a washing step as a post step of the crushing step, wherein the surface of the polycrystalline silicon mass is subjected to oxidation treatment using ozone water to coat the surface of the polycrystalline silicon mass with a silicon oxide film, and the washing step is completed in the state where the surface of the polycrystalline silicon mass is coated with the silicon oxide film.

The present invention comprises a removing step of removing at least 70 mm of a polycrystalline silicon portion from an electrode side end of a polycrystalline silicon rod obtained by the Siemens method. Thereby, the polycrystalline silicon portion in which the total of the chromium, iron, nickel, copper, and cobalt concentrations in a bulk is not less than 150 ppta is removed, and a clean and high-purity polycrystalline silicon mass having a small content of chromium, iron, nickel, copper, and cobalt in total, which are heavy metal impurities that reduce the quality of single-crystal silicon can be provided.

BRIEF DESCRIPTION OF DRAWINGS

FIG. 1 is a graph showing the result of theoretical calculation performed to determine the total of the concentrations of the heavy metal impurities in a polycrystalline silicon mass grown by the multi pulling method, which is tolerable for keeping the respective concentrations of chromium, iron, nickel, copper, and cobalt in CZ single-crystal silicon not more than 0.05 ppta.

FIG. 2 is a schematic view showing an example of an embodiment of a polycrystalline silicon rod used as a mother material for a polycrystalline silicon mass when the polycrystalline silicon mass is produced by the Siemens method.

FIG. 3 is a flowchart for describing an example of steps of producing a polycrystalline silicon mass according to the present invention.

FIG. 4 is an example of a graph showing a relationship between the distance from the electrode side end of a polycrystalline silicon rod to a portion of the polycrystalline silicon rod and the concentrations of the heavy metal impurities of chromium, iron, nickel, copper, and cobalt contained in the portion and the total of the concentrations.

FIG. 5 is a flowchart showing an example of a washing step.

DESCRIPTION OF EMBODIMENT

Hereinafter, with reference to the drawings, an embodiment according to the present invention will be described.

It is known that heavy metal impurities in CZ single-crystal silicon cause oxidation induced stacking faults (OSFs) and a reduced lifetime of minority carriers. Specifically, if the concentrations of chromium, iron, nickel, and copper in the CZ single-crystal silicon each are not more than 0.05 ppta, occurrence of OSFs is suppressed ("Shirikon no Kagaku (Science of Silicon)," p. 100, Table 5, 1996, published by Realize Science & Engineering Center Co., Ltd.: Non Patent Literature 1). Moreover, if the concentrations of chromium, iron, nickel, copper, and cobalt each are not more than 0.05 ppta, no substantial reduction in the lifetime of minority carriers is found. Accordingly, in order to obtain high quality CZ single-crystal silicon in which the OSFs hardly occur and the lifetime of minority carriers is long, the concentrations of chromium, iron, nickel, copper, and cobalt in CZ single-crystal silicon each need to be not more than 0.05 ppta.

The segregation coefficients of the respective heavy metal elements are already known, and the concentrations of the heavy metal impurities in a bulk of a polycrystalline silicon mass, which is tolerable for keeping the concentrations of impurities in the CZ single-crystal silicon not more than the value mentioned above, can be theoretically determined.

Table 1 shows the result of theoretical calculation performed to determine the concentrations of the heavy metal impurities in a bulk of a polycrystalline silicon mass tolerable for keeping the respective concentrations of chromium, iron, nickel, copper, and cobalt in CZ single-crystal silicon not more than 0.05 ppta in the case where the CZ single-crystal silicon is grown by the multi pulling method. FIG. 1 is a graph showing the result shown in Table 1. In the calculation, the solidified fraction in the final multi pulling was 0.9.

As shown in Table 1, in the case where the number of times of multi pulling, n is 1 (actually, no multi pulling is performed), the total of the concentrations of the heavy metal impurities in a bulk of a polycrystalline silicon mass tolerable for keeping the respective concentrations of chromium, iron, nickel, copper, and cobalt in the CZ single-crystal silicon not more than 0.05 ppta is 759 ppta. The total of the tolerable concentrations of heavy metal impurities reduces as the number of times of the multi pulling is increased. At n=5, the concentrations of the heavy metal impurities is approximately 150 ppta (152 ppta), and at n=10, the concentrations of the heavy metal impurities is approximately 75 ppta (76 ppta).

TABLE 1

| Element | Segregation coefficient | Solidified fraction | The number of times of multi pulling and tolerable concentrations of impurities in polycrystalline silicon mass (ppta) | | | | | | | | | |
|---|---|---|---|---|---|---|---|---|---|---|---|---|
| | | | 1 | 2 | 3 | 4 | 5 | 6 | 7 | 8 | 9 | 10 |
| Cr | 1.10E−05 | 0.9 | 465 | 227 | 152 | 114 | 91 | 76 | 65 | 57 | 51 | 45 |
| Fe | 8.00E−05 | 0.9 | 63 | 31 | 21 | 16 | 13 | 10 | 9 | 8 | 7 | 6 |

TABLE 1-continued

|  | Segregation coefficient | Solidified fraction | The number of times of multi pulling and tolerable concentrations of impurities in polycrystalline silicon mass (ppta) | | | | | | | | | |
|---|---|---|---|---|---|---|---|---|---|---|---|---|
| Element |  |  | 1 | 2 | 3 | 4 | 5 | 6 | 7 | 8 | 9 | 10 |
| Ni | 3.00E−05 | 0.9 | 167 | 83 | 56 | 42 | 33 | 28 | 24 | 21 | 19 | 17 |
| Cu | 4.00E−04 | 0.9 | 13 | 6 | 4 | 3 | 3 | 2 | 2 | 2 | 1 | 1 |
| Co | 8.00E−05 | 0.9 | 63 | 31 | 21 | 16 | 13 | 10 | 9 | 8 | 7 | 6 |
| Total | — | — | 759 | 379 | 253 | 190 | 152 | 126 | 108 | 95 | 84 | 76 |

Namely, if the CZ single-crystal silicon is grown by the multi pulling method using a raw material of a polycrystalline silicon mass in which the total of the concentrations of chromium, iron, nickel, copper, and cobalt detected from a polycrystalline silicon mass (the total of the concentrations of the heavy metal impurities detected from a bulk) is not more than 150 ppta, the crystal having no OSF can be obtained at the number of times of multi pulling of not more than 5. Moreover, defects at a deep level are hardly produced in the CZ single-crystal having such low concentrations of impurities, and the lifetime of the minority carriers are increased. The CZ single-crystal is also suitable for production of a silicon substrate for solar cells.

Moreover, if the CZ single-crystal silicon is grown by the multi pulling method using a raw material of a polycrystalline silicon mass in which the total of the concentrations of chromium, iron, nickel, copper, and cobalt detected from a polycrystalline silicon mass is not more than 100 ppta, the crystal having no OSF can be obtained at the number of times of multi pulling of not more than 7.

Further, in order to obtain the crystal having no OSF at the number of times of multi pulling of not more than 10, the raw material may be a polycrystalline silicon mass in which the total of the concentrations of chromium, iron, nickel, copper, and cobalt detected from polycrystalline silicon is not more than 75 ppta.

The concentrations of the heavy metal impurities in a polycrystalline silicon mass can be detected by an ICP-MS (Inductivity Coupled Plasma-Mass Spectrometry) method, for example. In the ICP-MS method, a polycrystalline silicon piece as a sample to be analyzed is dissolved in a small amount of a mixed acid of a hydrogen fluoride solution and nitric acid, and evaporated to dryness. The residue is dissolved in 5% nitric acid to prepare an aqueous solution, and the concentrations of chromium, iron, nickel, copper, and cobalt in the aqueous solution are analyzed.

Example

FIG. 2 is a schematic view showing an example of an embodiment of a polycrystalline silicon rod 100 used as a mother material for a polycrystalline silicon mass when the polycrystalline silicon mass is produced by the Siemens method. FIG. 3 is a flowchart for describing an example of steps of producing a polycrystalline silicon mass according to the present invention.

The polycrystalline silicon rod 100 has a first silicon core wire 31 and a second silicon core wire 32 disposed approximately in parallel to each other. The first silicon core wire 31 and the second silicon core wire 32 are connected by a silicon core wire 33 for connection. Polycrystalline silicon 10 is deposited on these core wires by a gaseous phase reaction, and formed.

One end of the first silicon core wire 31 and one end of the second silicon core wire 32 are inserted into conductive holders 51 and 52 made of carbon, for example, respectively. The conductive holders 51 and 52 are fixed to metal electrodes 61 and 62 made of copper or stainless steel and provided within a reactor of a vapor deposition apparatus (not shown). At this time, the first silicon core wire 31 and the second silicon core wire 32 are disposed approximately in parallel to each other in the vertical direction. The silicon core wire 33 for connection is disposed between the other end of the first silicon core wire 31 and the other end of the second silicon core wire 32 to connect the first and second silicon core wires 31 and 32 (core installation step: S101). Anticorrosive stainless steel is used for the wall of the reactor in the vapor deposition apparatus.

After the core installation step is completed, an atmosphere within the reactor is sequentially replaced with nitrogen and hydrogen, and heating of the first and second silicon core wires 31 and 32 and the silicon core wire 33 for connection is started in the hydrogen atmosphere. The first and second silicon core wires 31 and 32 and the silicon core wire 33 for connection are electrically conducted from the metal electrodes 61 and 62 through the conductive holders 51 and 52 and heated. After the temperature reaches a desired temperature (for example, 900° C. to 1100° C.), raw material gas such as trichlorosilane is fed into the growth furnace, and the polycrystalline silicon 10 is vapor deposited to form the polycrystalline silicon rod 100 (vapor deposition step: S102).

After the polycrystalline silicon 10 is grown to have a desired diameter (for example, 120 mm), feeding of the raw material gas is stopped, and the temperature within the reactor is reduced. The atmosphere within the reactor is replaced from hydrogen to nitrogen, and the reactor is opened to the atmosphere.

Because the polycrystalline silicon rod 100 vapor deposited in the hydrogen atmosphere has a hydrogen-terminated ($H_2$-terminated) surface, the surface is likely to adsorb metal grains such as chromium, iron, nickel, copper, and cobalt particularly in the post steps such as the extraction step and the crushing step.

For this reason, before the polycrystalline silicon rod 100 formed into an inverted U-shape is extracted, the surface of the polycrystalline silicon rod 100 is covered with a bag-like member for preventing contamination by metals (S103), and the covered polycrystalline silicon rod 100 is extracted from the reactor. Thereby, adhesion of iron powder produced from a crane or the like used for extraction or particles of chromium and nickel spread from the wall of the stainless steel reactor to the polycrystalline silicon rod 100 can be significantly suppressed.

Additionally, by covering the polycrystalline silicon rod 100 with a bag having high impact resistance and being difficult to break, even if the polycrystalline silicon rod 100 is broken during the extraction step, the broken portion is held within the bag. For this reason, the polycrystalline silicon 10 can be prevented from falling on the baseplate or the electrodes and being contaminated by chromium, nickel, or copper. Examples of the bag for preventing contamination by metals that is difficult to break include polyethylene bags.

Moreover, after extraction, the polycrystalline silicon rod 100 is disposed approximately horizontally, and the opening of the bag for preventing contamination by metals that covers the polycrystalline silicon rod 100 is sealed. Thereby, mixing of the metal grains from the opening into the bag and adhesion of the metal grains to the polycrystalline silicon rod 100 can be prevented.

In the case where a plurality of polycrystalline silicon rods 100 exist within the reactor, the total number of the polycrystalline silicon rods 100 is covered with the bags for preventing contamination by metals in advance, and the extraction step is started. Thereby, adhesion of the metals to the polycrystalline silicon rod 100 can be securely reduced.

The polycrystalline silicon rod 100 is covered with the bag for preventing contamination by metals, and extracted by a crane or the like from the reactor (extraction step: S104). The bag for preventing contamination by metals covers the polycrystalline silicon rod 100 until the polycrystalline silicon rod 100 is fed to the crushing step.

The polycrystalline silicon rod 100 extracted from the reactor is evacuated from the room installed with the vapor deposition apparatus as soon as possible, and stored in a clean room at a low level of environmental contamination. Thereby, the surface of the polycrystalline silicon rod 100 is kept as clean as possible. As described above, by sealing the opening of the bag for preventing contamination by metals, the polycrystalline silicon rod 100 can be kept much cleaner.

A heat resistant stainless steel plate is used for the baseplate of the vapor deposition apparatus. The stainless steel plate is gradually corroded in a high temperature chlorine-containing atmosphere. If the stainless steel plate is corroded, the metal grains containing nickel and chromium are spread in the growth atmosphere. Moreover, copper or stainless steel is used for the metal electrode. The polycrystalline silicon rod 100 on the electrode side is closer to the baseplate and the metal electrode, and the possibility of the contamination by metals is higher. Further, in contamination of the surface, even if the polycrystalline silicon rod 100 is covered with the bag for preventing contamination by metals during the extraction step S104, the bag is opened on the electrode side of the polycrystalline silicon rod 100. For this reason, the total of the concentrations of chromium, iron, nickel, copper, and cobalt detected from a bulk is likely to be higher toward the electrode side of the polycrystalline silicon rod 100.

Accordingly, before the crushing step, removal of a predetermined range of a polycrystalline silicon portion from the electrode side end of the polycrystalline silicon rod 100 extracted to the outside of the reactor is effective to reduction in the concentrations of the impurities.

FIG. 4 is an example of a graph showing a relationship between the distance from the electrode side end of the polycrystalline silicon rod 100 to a portion thereof and the concentrations of the respective heavy metal impurities of chromium, iron, nickel, copper, and cobalt contained in the portion and the total of the concentrations, which is determined by the test by the present inventors. The total of the concentrations of chromium, iron, nickel, copper, and cobalt is 198 ppta in a portion located at a distance from the electrode side end of 50 mm, 112 ppta in a portion located at a distance from the electrode side end of 100 mm, and 54 ppta in a portion located at a distance from the electrode side end of 220 mm. The measured value of the total of the concentrations is determined by curve approximation: the total of the concentrations in a portion located at a distance from the electrode side end of 70 mm is 149 ppta, and the total of the concentrations in a portion located at a distance from the electrode side end of 155 mm is 74 ppta.

Accordingly, the present invention comprises a removing step of removing at least 70 mm of a polycrystalline silicon portion from the electrode side end of the polycrystalline silicon rod 100 extracted to the outside of the reactor before the crushing step of the polycrystalline silicon rod 100 (S105). Thereby, the polycrystalline silicon portion in which the total of the concentrations of chromium, iron, nickel, copper, and cobalt in a bulk is not less than 150 ppta can be removed. In order to obtain a polycrystalline silicon mass having a lower concentration of the impurities, at least 155 mm of polycrystalline silicon portion from the electrode side end of the polycrystalline silicon rod may be removed. Thereby, the polycrystalline silicon portion having the total of the concentrations of the impurities of not less than 75 ppta can be removed.

Once the polycrystalline silicon rod 100 is crushed, the polycrystalline silicon masses are mixed. For this reason, it is difficult to discriminate a region H having the high concentrations of the heavy metal impurities from other regions. Moreover, during crushing, the metal grains may be spread from the region H having the high concentrations of the heavy metal impurities to other regions. For this reason, desirably, region H having the high concentrations of the heavy metal impurities is removed before the crushing step. The region H having the high concentrations of the heavy metal impurities can be removed by cutting using a rotary blade, for example.

Subsequently, the polycrystalline silicon rod 100 is crushed using a jaw crusher or a hammer to form polycrystalline silicon masses (crushing step: S106). Preferably, a contact portion with polycrystalline silicon in the jaw crusher or the hammer is made of cemented carbide (WC—Co alloy) obtained by sintering tungsten carbide with a cobalt alloy.

In the crushing step, the metal particles containing chromium, iron, nickel, or copper adhering to the surface of the polycrystalline silicon rod 100 are moved to the surface of the polycrystalline silicon mass, and the cobalt particles from the WC—Co alloy also adhere to the surface of the polycrystalline silicon mass. Then, in the next washing step (S107), the metal grains such as chromium, iron, nickel, copper, and cobalt adhering to the surface of the polycrystalline silicon mass are removed.

Tungsten (W) has a very small segregation coefficient of $1.7 \times 10^{-8}$, and substantially is not taken from the melt into the CZ single-crystal silicon. Accordingly, management of the amount of tungsten to be detected does not need to be as severe as that of the five kinds of metals.

FIG. 5 is a flowchart showing an example of a washing step. First, the polycrystalline silicon mass is placed in a basket for washing. The basket is swung in pure water to roughly remove polycrystalline silicon grains adhering to the surface of the polycrystalline silicon mass (prewashing step: S201).

Next, using a known washing liquid, a natural oxide film formed on the surface of the polycrystalline silicon mass is removed by etching (S202). As the washing liquid, for example, a mixed solution of a hydrogen fluoride solution, a hydrogen peroxide solution, and water (FPM solution) or a mixed solution of a hydrogen fluoride solution and nitric acid (fluoronitric acid) can be used. In the present Example, the polycrystalline silicon masses are immersed in a bath containing a first chemical solution prepared by mixing a hydrogen fluoride solution, a hydrogen peroxide solution and water, and the natural oxide film formed on the surfaces of the polycrystalline silicon masses is removed by etching while the polycrystalline silicon masses are swung.

The FPM solution removes the natural oxide film formed on the surface of the polycrystalline silicon mass by etching, and removes the metal grains in the natural oxide film or adhering onto the natural oxide film together with the natural oxide film by etching, but hardly etches the polycrystalline silicon itself. Accordingly, reduction in yield can be suppressed.

Moreover, fluoronitric acid can remove not only the natural oxide film formed on the surface of the polycrystalline silicon mass but also the polycrystalline silicon itself by etching, and it is effective to remove the metal grains adhering to depressions of the polycrystalline silicon mass, for example. An ability to remove the metal grains is higher as the amount of etching is larger. By etching not less than 20 m, the metal grains adhering to the surface of the polycrystalline silicon mass can be sufficiently removed.

After the etching step is completed, the polycrystalline silicon masses are immersed in a rinsing bath, and rinsed with pure water. When necessary, a plurality of rinsing bathes is used.

The polycrystalline silicon masses after the etching step were analyzed by the IPC-MS method. As a result, in each of the masses analyzed, the total of the concentrations of chromium, iron, nickel, copper, and cobalt detected from a bulk was not more than 75 ppta.

If the surface of the polycrystalline silicon mass is once cleaned and the metal grains adhere to the surface of the polycrystalline silicon mass again later, the effect of washing is undesirably reduced. Accordingly, in the present invention, in the final step of the washing step, the surface of the polycrystalline silicon mass is subjected to oxidation treatment by ozone water to coat the polycrystalline silicon mass with a silicon oxide film. At this time, ozone water also decomposes and removes organic substances adhering to the surface of the polycrystalline silicon mass.

If the surface of the polycrystalline silicon mass is coated with a silicon oxide film, the surface of the polycrystalline silicon mass becomes inactive. Accordingly, the metal grains are difficult to adhere to the surface of the polycrystalline silicon mass again. Moreover, dirt referred to as a stain is difficult to occur. Further, even if the metal grains adhere, the metal grains adhere through the silicon oxide film to the polycrystalline silicon mass. For this reason, bond between the metal grains and the polycrystalline silicon is weak. The polycrystalline silicon mass is kept clean, in which the total of the concentrations of the five element metals is kept not more than 75 ppta.

In the present Example, the polycrystalline silicon mass is immersed in ozone water, and the cleaned surface of the polycrystalline silicon mass is coated with a silicon oxide film (oxidation step: S203). Finally, the polycrystalline silicon mass is dried by clean warm air or in vacuum (drying step: S204). Thereby, the surface of the polycrystalline silicon mass is coated with a clean silicon oxide film, and the washing step is completed.

The thus-obtained polycrystalline silicon mass having the total of the concentrations of chromium, iron, nickel, copper, and cobalt of not more than 75 ppta is used as the raw material. Thereby, the CZ single-crystal silicon in which occurrence of OSFs and reduction in the lifetime of minority carriers are suppressed can be obtained even if at least 10 single-crystal silicon ingots are grown by the multi pulling method and pulled up in a single batch.

INDUSTRIAL APPLICABILITY

According to the present invention, a clean and high-purity polycrystalline silicon mass having a small content of chromium, iron, nickel, copper, and cobalt in total, which are heavy metal impurities that reduce the quality of single-crystal silicon, is provided.

REFERENCE SIGNS LIST

10 Polycrystalline silicon
31 First silicon core wire
32 Second silicon core wire
33 Silicon core wire for connection
51, 52 Conductive holder
61, 62 Metal electrode
100 Polycrystalline silicon rod
H Region having high concentrations of heavy metal impurities

The invention claimed is:

1. A process for producing a polycrystalline silicon mass, the process comprising:
vapor depositing silicon on a core wire to obtain a polycrystalline silicon rod, one end of the core wire being connected to a first electrode and the other end thereof being connected to a second electrode;
extracting the polycrystalline silicon rod to an outside of a reactor;
removing at least 70 mm of a polycrystalline silicon portion from an electrode side end of the polycrystalline silicon rod extracted to the outside of the reactor;
crushing the polycrystalline silicon rod into polycrystalline silicon mass, and
washing the polycrystalline silicon mass,
wherein said washing comprises:
prewashing, etching, oxidation treating with an aqueous solution of ozone to coat a surface of the polycrystalline silicon mass with a silicon oxide film, and drying.

2. The process of claim 1, wherein at least 155 mm of the polycrystalline silicon portion from the electrode side end is removed.

3. The process of claim 1, wherein the extracting comprises covering a surface of the polycrystalline silicon rod with a bag member.

4. The process of claim 3, wherein an opening of the bag member that covers the surface of the polycrystalline silicon rod is sealed after the polycrystalline silicon rod is extracted to the outside of the reactor.

5. The process of claim 3, wherein the bag member is a polyethylene bag.

6. The process of claim 1, wherein the prewashing is performed in water.

7. The process of claim 1, wherein the etching is performed in a mixed solution comprising hydrofluoric acid, hydrogen peroxide, and water.

8. The process of claim 7, wherein the hydrofluoric acid is hydrogen fluoride.

9. The process of claim 1, wherein the etching is performed in a mixed solution comprising hydrofluoric acid and nitric acid.

10. The process of claim 9, wherein the etching removes at least 20 μm from a surface of the polycrystalline silicon mass.

11. The process of claim 1, wherein the drying is performed in air or in a vacuum.

\* \* \* \* \*